US006322634B1

(12) United States Patent
Pan

(10) Patent No.: US 6,322,634 B1
(45) Date of Patent: *Nov. 27, 2001

(54) SHALLOW TRENCH ISOLATION STRUCTURE WITHOUT CORNER EXPOSURE

(75) Inventor: Pai-Hung Pan, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/789,470

(22) Filed: Jan. 27, 1997

(51) Int. Cl.⁷ .................................................. H01L 21/762
(52) U.S. Cl. .......................... 148/33.3; 257/506; 257/513
(58) Field of Search ..................................... 257/506, 510, 257/513; 148/33.3; 438/424

(56) References Cited

U.S. PATENT DOCUMENTS

| | | |
|---|---|---|
| 4,307,180 * | 12/1981 | Pogge . |
| 4,786,954 | 11/1988 | Morie et al. . |
| 4,849,344 | 7/1989 | Desbiens et al. . |
| 5,173,439 | 12/1992 | Dash . |
| 5,272,117 | 12/1993 | Roth et al. . |
| 5,296,392 | 3/1994 | Grula et al. . |
| 5,297,082 | 3/1994 | Lee . |
| 5,346,587 | 9/1994 | Doan et al. . |
| 5,433,794 | 7/1995 | Fazan et al. . |
| 5,436,488 | 7/1995 | Poon et al. . |
| 5,459,096 | 10/1995 | Venkatesan et al. . |
| 5,492,858 | 2/1996 | Bose et al. . |
| 5,506,168 * | 4/1996 | Morita et al. . |
| 5,516,625 | 5/1996 | McNamara et al. . |
| 5,516,721 | 5/1996 | Galli et al. . |
| 5,521,422 | 5/1996 | Mandelman et al. . |
| 5,677,233 * | 10/1997 | Abiko . |
| 5,683,932 * | 11/1997 | Bashir et al. . |
| 5,712,185 * | 1/1998 | Tsai et al. . |
| 5,801,083 * | 9/1998 | Yu et al. . |
| 5,811,346 * | 9/1998 | Sur et al. . |
| 5,834,358 * | 11/1998 | Pan et al. . |
| 5,960,297 | 9/1999 | Saki . |

OTHER PUBLICATIONS

Davari, et al., "A Variable–Size Shallow Trench Isolation (STI) Technology With Diffused Sidewall Doping For Sub–micron CMOS", *IEEE IEDM* (1988).

K. Blumenstock et al., "Shallow Trench Isolation for Ultra–Large–Scale Integrated Devices", *J. Vac. Sci. Technol.*, B 12(1) (Jan./Feb. 1994).

* cited by examiner

*Primary Examiner*—George Fourson
(74) *Attorney, Agent, or Firm*—TraskBritt

(57) ABSTRACT

A shallow isolation trench structure and methods of forming the same wherein the method of formation comprises a layered structure of a buffer film layer over a dielectric layer which is atop a semiconductor substrate. The buffer film layer comprises a material which is oxidation resistant and can be etched selectively to oxide films. The layered structure is patterned with a resist material and etched to form a shallow trench. A thin oxide layer is formed in the trench and the buffer film layer is selectively etched to move the buffer film layer back from the corners of the trench. An isolation material is then used to fill the shallow trench and the buffer film layer is stripped to form an isolation structure. When the structure is etched by subsequent processing step(s), a capped shallow trench isolation structure which covers the shallow trench corners is created.

20 Claims, 4 Drawing Sheets

SHALLOW TRENCH ISOLATION STRUCTURE WITHOUT CORNER EXPOSURE

BACKGROUND OF THE INVENTION

1. Field of the Invention

The present invention relates to an apparatus and method for forming a shallow trench isolation structure. More particularly, the present invention relates to forming the shallow trench isolation structure using a buffer film layer etched such that a capped trench structure is formed which isolates the shallow trench corners.

2. State of the Art

The semiconductor industry continually strives to increase semiconductor device performance and density by miniaturizing the individual semiconductor components and by miniaturizing the overall semiconductor device dimensions. For example, the semiconductor device density can be increased by more densely integrating the components on the semiconductor chip. However, increasing integration densities by placing the individual circuit elements in closer proximity increases the potential for interactions between the circuit elements. Therefore, it has become necessary to include isolation structures to prevent any significant interaction between circuit elements on the same chip.

Contemporary CMOS technologies generally employ field effect transistors that are adjacent or bounded by trenches. These trenches provide isolation (shallow trench isolation or "STI") for the semiconductor devices. However, the close proximity of each semiconductor device to an edge or corner of the trench may create parasitic leakage paths. The parasitic leakage paths result from an enhancement of the gate electric field near the trench corners. This gate electric field is enhanced by the trench corner's small radius of curvature and the proximity of the gate conductor. As a result of the enhanced gate electric field, the trench corner has a lower threshold voltage ($V_t$) than the planar portion of the device.

Presently known formation techniques for such trenches generally involve a wet etch, which can exacerbate the parasitic leakage problem by sharpening the trench corners and thinning the gate dielectric near the trench corner. Furthermore, present trench formation techniques generally expose the trench corners before gate electrode deposition. The exposure of trench corners will increase the sub-$V_t$ leakage and degrade gate oxide integrity. The aforementioned problems will be hereinafter referred to collectively as "corner effects."

Corner effects can even dominate on-currents in applications such as DRAM chips that require narrow channel widths to achieve high density. This parallel current-carrying corner effect becomes the dominant MOSFET contributor to standby current in low standby power logic applications and to leakage in DRAM cells. Furthermore, there exists concern that the enhanced electric fields due to field crowding at the trench corner may impact dielectric integrity.

Numerous techniques have been proposed to overcome the above discussed corner effects. Commonly-owned U.S. Pat. No. 5,433,794 issued Jul. 18, 1995 to Fazan et al., hereby incorporated herein by reference, and U.S. Pat. No. 5,521,422 issued May 28, 1996 to Mandelman et al., each teach forming shallow trench isolation structures wherein insulating material spacers are formed abutting the trench corner and the isolating material filling and extending above the trench. When a wet pad oxide etch is performed, the isolating material combines with the spacers to form an isolation trench having a dome or cap-like covering the peripheral edges of the trench which substantially overcomes the corner effects and consequential leakage between active areas on the substrate. Although the techniques taught in these patents are effective in minimizing corner effects, the techniques require additional fabrication steps which increase the overall cost of the semiconductor component.

U.S. Pat. No. 5,436,488 issued Jul. 25, 1995 to Poon et al. teaches improving trench isolation by increasing the thickness of the gate dielectric overlying the trench corner between the substrate and gate electrode. However, the process taught in this patent also requires numerous additional fabrication steps and structures, which of course increase the overall cost of the semiconductor component.

Therefore, it would be advantageous to develop a shallow isolation trench and a technique for forming the trench which substantially eliminates the aforementioned corner effects, while using inexpensive, commercially-available, widely-practiced semiconductor device fabrication techniques and apparatus.

SUMMARY OF THE INVENTION

The present invention relates to a shallow isolation trench structure which is formed using a buffer film layer. The buffer film layer is etched in such a manner that an isolation material within the shallow trench has a cap which covers the shallow trench corner to prevent corner effects.

The method of the present invention comprises providing a semiconductor substrate, preferably a silicon substrate, with a dielectric layer, preferably silicon dioxide, formed on at least one surface of the semiconductor substrate to a thickness of between 50 and 300 Å. The dielectric layer can be formed by any known technique, including thermally oxidizing the surface of the semiconductor substrate, chemical vapor deposition, sputtering, or the like. A buffer film layer, preferably silicon nitride, is then formed over the dielectric layer by any known deposition technique, preferably chemical vapor deposition. Although silicon nitride is preferred, the buffer layer may be any known material which is oxidation resistant and can be etched selectively to oxide films.

A photoresist mask is applied and patterned on the buffer film layer. The buffer film layer, the dielectric layer, and semiconductor substrate are then etched either simultaneously with a non-selective etch or in steps with selective etches to form a shallow trench with sidewalls and a bottom. The photoresist mask is then removed to form a trenched structure.

After stripping the photoresist and cleaning the trenched structure, a thin layer of oxide, between about 50 and 150 Å thick, is grown on the shallow trench sidewalls and bottom, preferably by thermal oxidization. The buffer film layer is then selectively etched horizontally and vertically to move the buffer film layer back from the shallow trench. The purpose for using a buffer film layer, which is oxidation resistant, as discussed above, is shown in FIG. 11. If an oxidizable material is used as a buffer film layer 202 over a dielectric layer 204 and a substrate 206, the formation of a thin oxide layer 208 in trench 210 would also cause the formation of an additional thin layer of oxide 212 to form on the buffer film layer 202. Most oxidizable materials, such as silicon dioxide, used for forming the buffer film layer 202 have a greater affinity for growing oxides than the semiconductor substrate. As a results, the additional thin oxide layer 212 is relatively thicker than the thin oxide layer 208, which results in a narrowing of the opening at the mouth of the trench 210. This narrowing makes it difficult to fill the trench 210 with an isolation material 214, and may even cause the formation of voids 216 in the isolation material 214 during the application of the isolation material 214.

In the method of the present invention, after etching back the buffer film layer, the shallow trench is then filled with an isolation material. The resulting structure is preferably annealed to densify the deposited isolation material. Densification of the deposited isolation material is required to enhance the resistance of the isolation material to etching during subsequent processing. A portion of the isolation material over the buffer film layer is then removed to the level of the buffer film layer. The removal of isolation material is preferably achieved with a process such as chemical mechanical planarization which abrades away the isolation material down to the buffer film layer. The buffer film layer is then selectively etch away to form an isolation structure. When this isolation structure is etched during a subsequent wet oxide etch process, the isolation structure will form the capped shallow trench isolation structure which covers the trench corner. This capped shallow trench isolation structure substantially minimizes corner effects.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
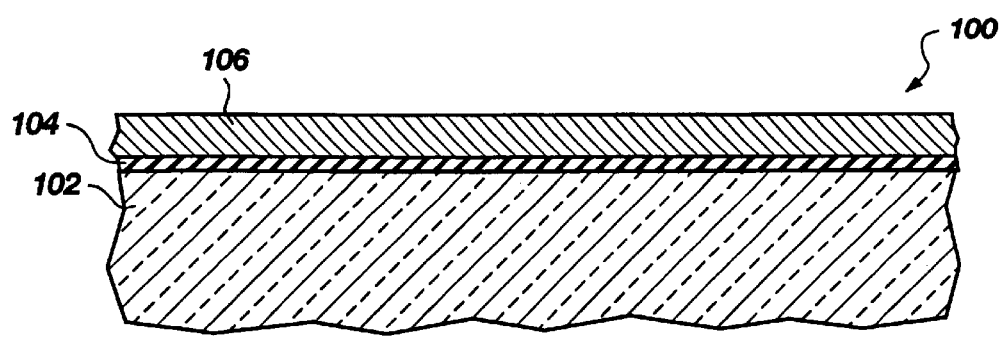
FIGS. 1–10 are cross-sectional views of the method of forming a shallow trench isolation structure of the present invention.

FIGS. 1 through 10 illustrate, in cross-section, a method for forming a shallow trench isolation structure in accordance with one embodiment of the present invention. As shown in FIG. 1, the method comprises forming a layered structure 100 of a semiconductor substrate 102, a dielectric layer 104, and a buffer film layer 106. The semiconductor substrate 102 preferably includes silicon and the dielectric layer 104 preferably includes silicon dioxide. The dielectric layer 104 is preferably between 50 and 300 Åthick (a convenient range for process integration) and can be formed by any known technique including thermally oxidizing the surface of the semiconductor substrate 102, chemical vapor deposition, sputtering, or the like. The buffer film layer 106, preferably comprising silicon nitride, is formed over the dielectric layer 104 by any known deposition technique, preferably chemical vapor deposition.

Figure 2:
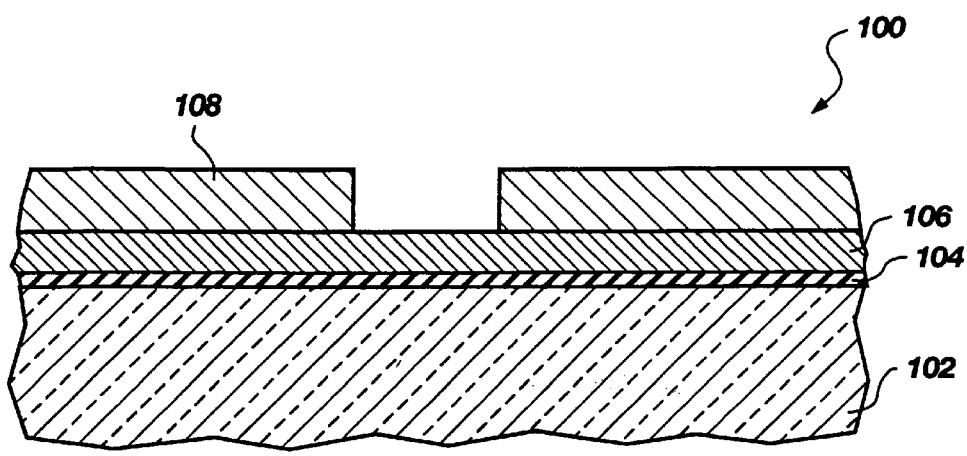
Figure 3:
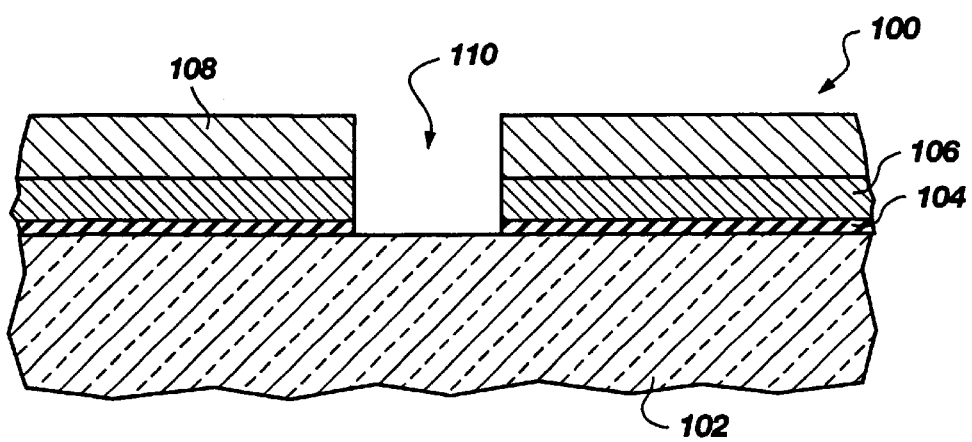
Figure 4:
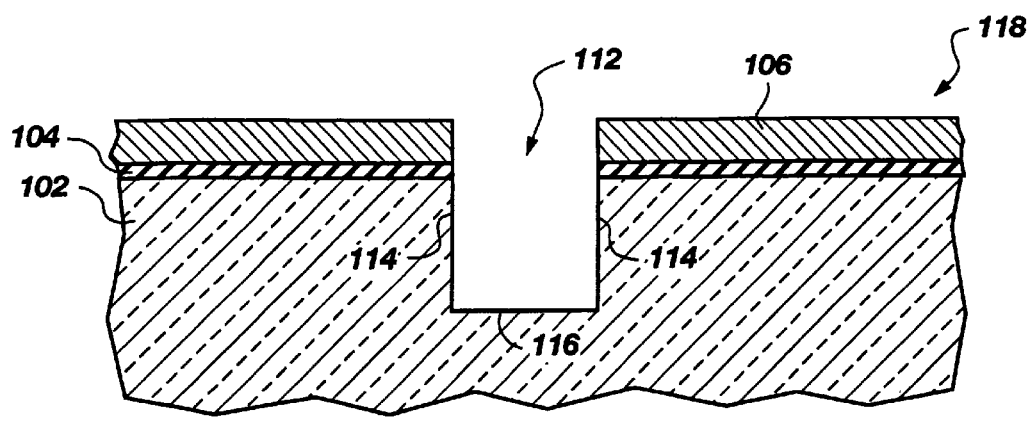

A photoresist mask 108, either positive or negative resist (preferably positive) as known in the art, is applied over the buffer film layer 106 and patterned using standard photolithographic patterning techniques, as shown in FIG. 2. The buffer film layer 106 and the dielectric layer 104 are then etched by standard etching techniques to form patterned recess 110, as shown in FIG. 3. The silicon substrate 102 is then dry etched to form a shallow trench 112 with sidewalls 114 and a bottom 116, seen in FIG. 4. It is, of course, understood that the buffer film layer 106, the dielectric layer 104, and semiconductor substrate 102 can be etched in one non-selective etching step. The photoresist mask 108 is removed using standard photoresist stripping techniques, preferably by plasma etch, to form a trenched structure 118, as shown in FIG. 4.

Figure 5:
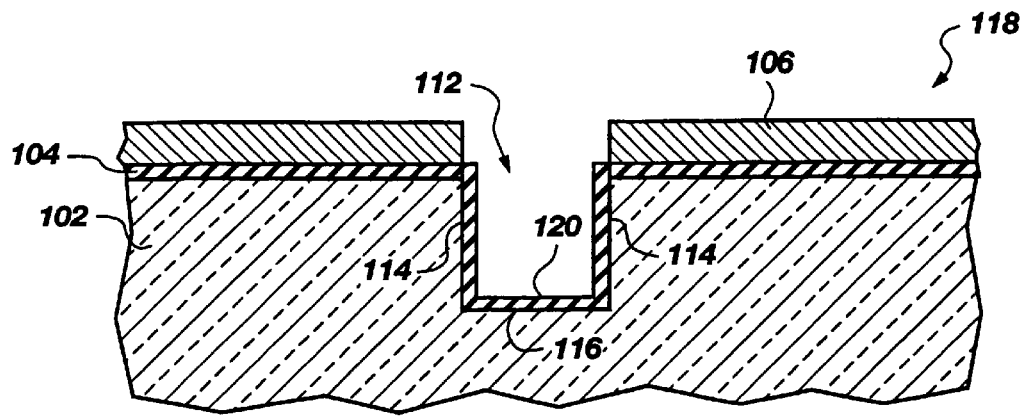
Figure 6:
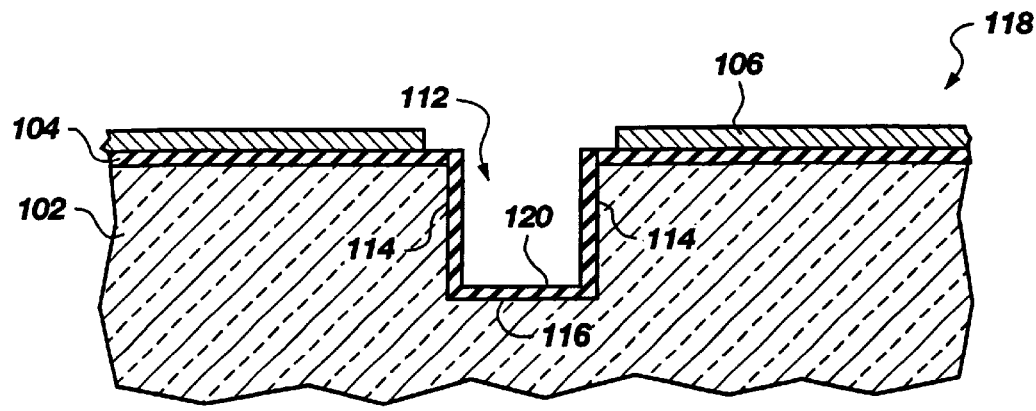

After stripping the photoresist and cleaning (preferably with an $H_2O_2/H_2SO_4$ or $H_2O_2/HCl$ mixture) the trenched structure 118, a thin layer of oxide 120, between about 50 and 150 Åthick, is grown on the shallow trench sidewalls 114 and the shallow trench bottom 116, preferably by thermal oxidization, as shown in FIG. 5. As shown in FIG. 6, the buffer film layer 106 is then selectively etched horizontally and vertically to move the buffer film layer 106 back from the shallow trench 112. The etching of the buffer film layer 106 is preferably a wet etch process including an application of a 100:1 HF (hydrofluoric acid) solution followed by an application of a $H_3PO_4$(phosphoric acid) solution or an $H_2O/N(CH_2CH_3)_4OH$ ("TMAH") solution.

Figure 7:
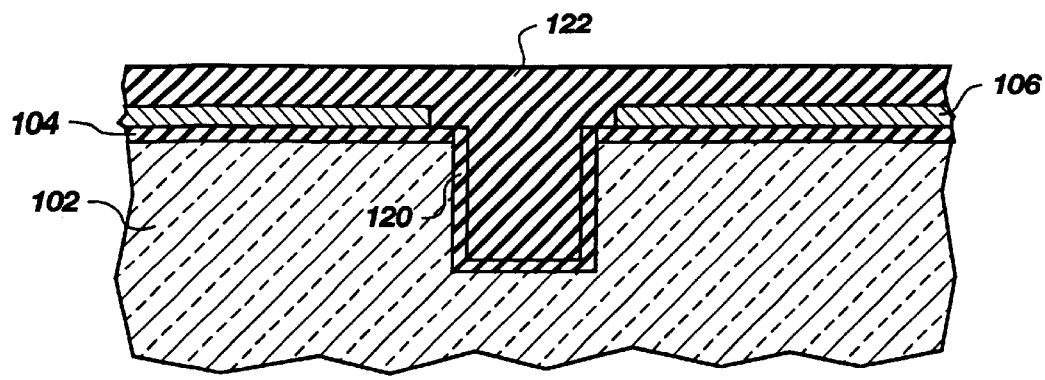

The shallow trench 112 is then filled with an isolation material 122, as shown in FIG. 7. The isolation material 122 is preferably silicon dioxide deposited by any known technique including chemical vapor deposition using tetraethylorthosilane (TEOS) or ozone as source gases, electron cyclotron resonance deposition, spin-on deposition, and the like. Optionally, the isolation material 122 can be annealed to densify the deposited isolation material 122. Densification of the deposited isolation material 122 is used to enhance the resistance of the isolation material 122 to etching during subsequent processing. The annealing is preferably conducted in a nitrogen or other inert gas atmosphere to prevent oxidation of the semiconductor substrate 102 beneath the isolation material 122.

Figure 8:
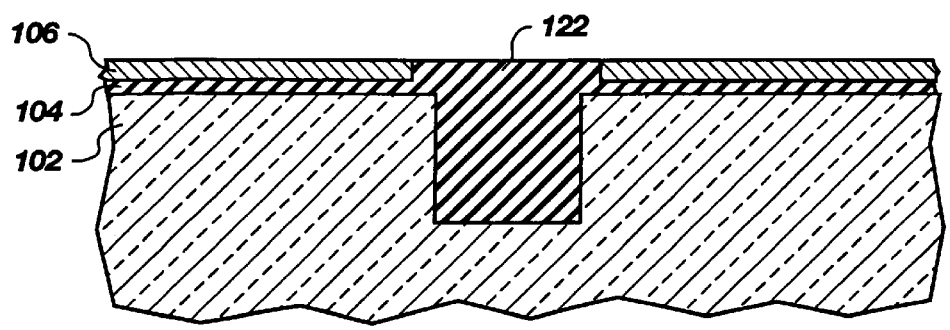
Figure 9:
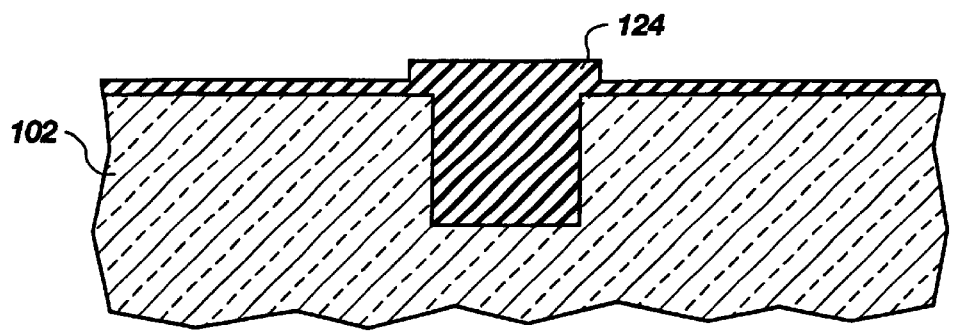
Figure 10:
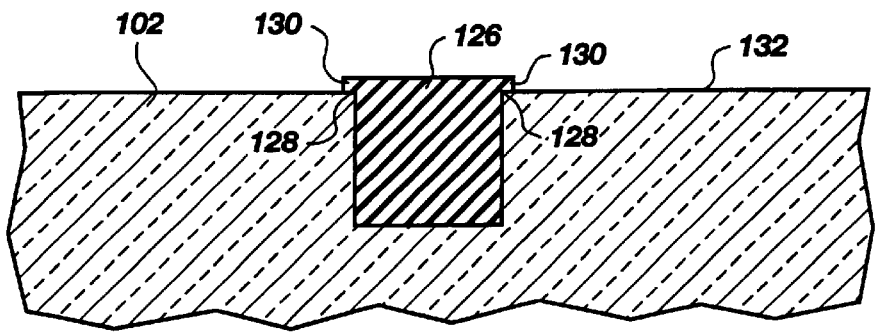
Figure 11:
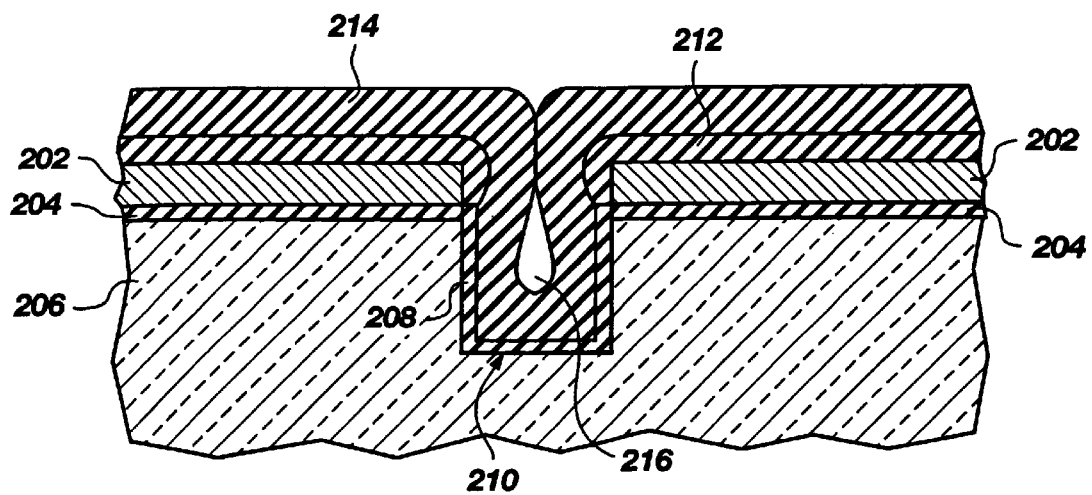
FIG. 11 is a cross-sectional view of a shallow trench isolation structure formed with a conventional oxidizable buffer film layer.

As shown in FIG. 8, the isolation material 122 is removed down to the buffer film layer 106, preferably by a mechanical abrasion process, such as chemical/mechanical planarization. The buffer film layer 106 is then selectively etched away, by any known technique such as a hot $H_3PO_4$ (phosphoric acid), to form an isolation structure 124, as shown in FIG. 9. When this isolation structure 124 is etched during a subsequent wet oxide process to expose the upper surface 132 of said semiconductor substrate 102, the isolation structure 124 will form a capped shallow trench isolation structure 126 which covers the trench corner 128 of the shallow trench 112 with ledges 130, a s shown in FIG. 10. The ledges 130 preferably extend horizontally between about 50 and 150 Åfrom the trench corner 128. These ledges 130 prevent the aforementioned corner effects.

Having thus described in detail preferred embodiments of the present invention, it is to be understood that the invention defined by the appended claims is not to be limited by particular details set forth in the above description, as many apparent variations are possible without departing from the spirit or scope thereof.

What is claimed is:

1. A precursor to a semiconductor device structure including a shallow trench isolation structure having a substantially flat surface and an integral ledge which extends laterally outward from a trench formed in a semiconductor device layered structure including a semiconductor substrate so as to contact only an area of an active surface of the semiconductor substrate adjacent the trench, the precursor including a buffer film layer over the semiconductor substrate, the precursor formed by the method comprising:

disposing a first oxide layer on the active surface of the semiconductor substrate;

disposing the buffer film layer of substantially oxidation resistant and selectively etchable material on said first oxide layer;

exposing at least one portion of said active surface through the buffer film layer and through said first oxide layer;

removing at least one portion of the semiconductor substrate to form the trench;

forming a second oxide layer on exposed portions of said semiconductor substrate within the trench;

selectively etching a portion of the buffer film layer to expose at least one trench edge at a juncture of the trench and the active surface of the semiconductor substrate;

applying a layer of isolation material over the buffer film layer to fill the trench;

removing a portion of said layer of isolation material above the buffer film layer; and densifying the isolation material.

2. The precursor of claim 1, wherein forming said second oxide layer includes thermally oxidizing said exposed portions of said semiconductor substrate within the trench.

3. The precursor of claim 1, wherein selectively etching said portion of the buffer film layer includes horizontal and vertical etching of the buffer film layer.

4. The precursor of claim 3, wherein selectively etching the buffer film layer portion comprises retaining a portion of the buffer film layer located over said semiconductor substrate and extending a predetermined distance from the trench.

5. An intermediate semiconductor device structure, comprising:

a semiconductor substrate having at least one trench formed in an active surface thereof and at least one trench corner located at a juncture between said at least one trench and said active surface; and a buffer film layer over said semiconductor substrate, said buffer film layer comprising a substantially oxidation resistant materials; and at least one densified trench isolation structure having a substantially flat surface exposed through said buffer film layer, said at least one corner being covered by said at least one densified trench isolation structure.

6. The intermediate semiconductor device structure of claim 5, further comprising a layer comprising silicon oxide disposed within said at least one trench and between said semiconductor substrate and said buffer film layer.

7. The intermediate semiconductor device structure of claim 6, wherein said layer comprises densified silicon dioxide.

8. An intermediate semiconductor device structure, comprising:

a semiconductor substrate having at least one trench formed in an active surface thereof and at least one trench corner located at a juncture between said at least one trench and said active surface; and at least one trench isolation structure comprising densified silicon dioxide and having a substantially flat surface, said at least one trench isolation structure extending laterally only over a portion of said active surface adjacent said at least one trench corner so as to electrically isolate said at least one trench corner.

9. The intermediate semiconductor device structure of claim 8, further comprising a silicon oxide layer disposed between said semiconductor substrate and said at least one trench isolation structure.

10. The intermediate semiconductor device structure of claim 9, wherein said silicon oxide layer comprises densified silicon dioxide.

11. The precursor of claim 1, wherein said disposing the buffer film layer comprises disposing silicon nitride on said first oxide layer.

12. The intermediate semiconductor device structure of claim 5, wherein said buffer film layer comprises silicon nitride.

13. The intermediate semiconductor device structure of claim 5, wherein at least a portion of said active surface of said semiconductor substrate adjacent said at least one trench corner is exposed through said buffer film layer.

14. A precursor to a semiconductor device structure including a shallow trench isolation structure, said shallow trench isolation structure comprising densified silicon dioxide including a substantially planar surface and at least one integral ledge which extends laterally outward from at least one trench formed in a semiconductor substrate so as to contact an area of an active surface of the semiconductor substrate adjacent the at least one trench, the precursor including a buffer film layer over the semiconductor substrate, the substantially planar surface being exposed through the buffer film layer, the precursor formed by the method comprising:

disposing a first oxide layer over the active surface of the semiconductor substrate;

disposing the buffer film layer of substantially oxidation resistant and selectively etchable material over said first oxide layer;

exposing at least one portion of said active surface through the buffer film layer and through said first oxide layer; and removing at least one portion of the semiconductor substrate to form the at least one trench.

15. The precursor of claim 14, wherein the method further comprises forming a second oxide layer on exposed portions of the semiconductor substrate with the at least one trench.

16. The precursor of claim 15, wherein the method further comprises selectively etching a portion of the buffer film layer to expose at least one region of the active surface of the semiconductor substrate adjacent a juncture of the at least one trench and the active surface.

17. The precursor of claim 16, wherein the method further comprises applying a layer of isolation material over the buffer film layer to fill the at least one trench.

18. The precursor of claim 17, wherein the method further comprises removing a portion of said layer of isolation material above the buffer film layer.

19. The precursor of claim 14, wherein said disposing the buffer film layer comprises disposing silicon nitride.

20. The intermediate semiconductor device structure of claim 8, further comprising a layer including silicon nitride over said semiconductor substrate.

* * * * *